(12) United States Patent
Chia et al.

(10) Patent No.: US 10,461,243 B2
(45) Date of Patent: Oct. 29, 2019

(54) TUNING MAGNETIC ANISOTROPY FOR SPIN-TORQUE MEMORY

(71) Applicant: EVERSPIN TECHNOLOGIES, INC., Chandler, AZ (US)

(72) Inventors: Han-Jong Chia, Chandler, AZ (US); Jon Slaughter, Albany, NY (US)

(73) Assignee: Everspin Technologies, Inc., Chandler, AZ (US)

( * ) Notice: Subject to any disclaimer, the term of this patent is extended or adjusted under 35 U.S.C. 154(b) by 3 days.

(21) Appl. No.: 15/888,136

(22) Filed: Feb. 5, 2018

(65) Prior Publication Data
US 2018/0226569 A1    Aug. 9, 2018

Related U.S. Application Data

(60) Provisional application No. 62/455,086, filed on Feb. 6, 2017.

(51) Int. Cl.
| | |
|---|---|
| H01L 21/68 | (2006.01) |
| H01L 43/08 | (2006.01) |
| G11C 11/16 | (2006.01) |
| H01F 10/32 | (2006.01) |
| H01L 43/10 | (2006.01) |
| H01L 27/22 | (2006.01) |

(52) U.S. Cl.
CPC ............ *H01L 43/08* (2013.01); *G11C 11/161* (2013.01); *H01F 10/329* (2013.01); *H01F 10/3272* (2013.01); *H01F 10/3254* (2013.01); *H01F 10/3286* (2013.01); *H01L 27/222* (2013.01); *H01L 43/10* (2013.01)

(58) Field of Classification Search
CPC .............................. H01L 21/68; H01L 21/302
See application file for complete search history.

(56) References Cited

U.S. PATENT DOCUMENTS

2007/0177420 A1*  8/2007  Guo ................... B82Y 25/00
                                                            365/158

* cited by examiner

*Primary Examiner* — Mohammad M Choudhry
(74) *Attorney, Agent, or Firm* — Bookoff McAndrews, PLLC

(57) ABSTRACT

Techniques for configuring the layers included in the free portion of a spin-torque magnetoresistive device are presented that allow for characteristics of the free portion to be tuned to meet the needs of various applications. In one embodiment, high data retention is achieved by balancing the perpendicular magnetic anisotropy of the ferromagnetic layers in the free portion. In other embodiments, imbalanced ferromagnetic layers provide for lower switching current for the magnetoresistive device. In various embodiments, different coupling layers can be used to provide exchange coupling between the ferromagnetic layers in the free portion, including oscillatory coupling layers, ferromagnetic coupling layers using materials that can alloy with the neighboring ferromagnetic layers, and discontinuous layers of dielectric material such as MgO that result in limited coupling between the ferromagnetic layers and increases perpendicular magnetic anisotropy (PMA) at the interface with those layers.

20 Claims, 4 Drawing Sheets

TUNING MAGNETIC ANISOTROPY FOR SPIN-TORQUE MEMORY

CROSS REFERENCE TO RELATED APPLICATIONS

This application claims priority to U.S. Provisional Application No. 62/455,086 filed Feb. 6, 2017. The content of that provisional application is incorporated by reference herein in its entirety.

TECHNICAL FIELD

The present disclosure relates generally to spin-torque magnetic memory, and more particularly to tuning the layers in a free portion used for data storage in spin-torque memory.

BACKGROUND

Spin-torque magnetic memory devices store data based on varying the resistance across the memory device such that a read current through a memory cell in the memory device will result in a voltage drop having a magnitude that is based on the information stored in the memory cell. For example, in certain magnetic memory devices, the voltage drop across a magnetic tunnel junction (MTJ) can be varied based on the relative magnetic states of the magnetoresistive layers within the memory cell. In such memory devices, there is typically a portion of the memory cell that has a fixed magnetic state and another portion that has a free magnetic state that is controlled to be either parallel or antiparallel to the fixed magnetic state. Because the resistance through the memory cell changes based on whether the free portion is parallel or antiparallel to the fixed portion, information can be stored by setting the magnetic orientation of the free portion. The information is later retrieved by sensing the magnetic orientation of the free portion. Such magnetic memory devices are well known in the art.

Writing magnetic memory cells can be accomplished by sending a spin-polarized write current through the memory device where the angular momentum carried by the spin-polarized current can change the magnetic state of the free portion. One of ordinary skill in the art understands that such a current can either be directly driven through the memory cell or can be the result of applying one or more voltages where the applied voltages result in the desired current. Depending on the direction of the current through the memory cell, the resulting magnetization of the free portion will either be parallel or antiparallel to the fixed portion. If the parallel orientation represents a logic "0", the antiparallel orientation represents a logic "1", or vice versa. Thus, the direction of write current flow through the memory cell determines whether the memory cell is written to a first state or a second state. Such memory devices are often referred to as spin-torque transfer memory devices. In such memories, the magnitude of the write current is typically greater than the magnitude of a read current used to sense the information stored in the memory cells.

Manufacturing magnetoresistive devices, including MTJ devices, includes a sequence of processing steps during which many layers of materials are deposited and then patterned to form a magnetoresistive stack and the electrodes used to provide electrical connections to the magnetoresistive stack. The magnetoresistive stack includes various layers that make up the free and fixed portions of the device as well as one or more dielectric layers that provide at least one the tunnel junction for the MTJ device. In many instances, the layers of material are very thin, on the order of a few or tens of angstroms.

Magnetic memory devices that have different materials included in their magnetoresistive stacks exhibit different characteristics. Therefore, it is desirable to provide techniques for producing such devices that ensure proper operation while supporting the desired characteristics important to the application in which the memory device is to be used.

DETAILED DESCRIPTION

Figure 1:
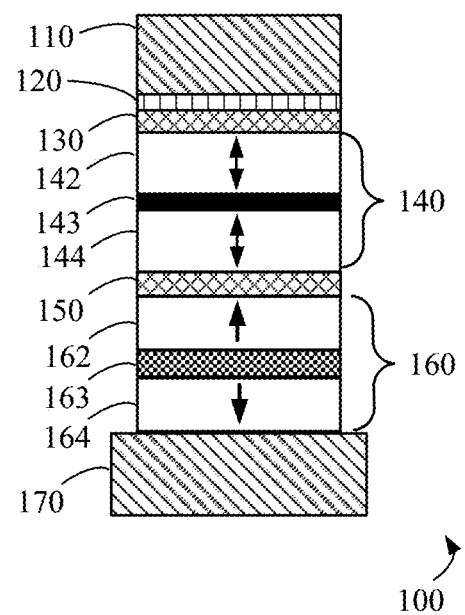
FIGS. 1-6 are block diagrams of magnetoresistive devices in accordance with exemplary embodiments.

The following detailed description is merely illustrative in nature and is not intended to limit the embodiments of the subject matter or the application and uses of such embodiments. Any implementation described herein as exemplary is not necessarily to be construed as preferred or advantageous over other implementations.

For simplicity and clarity of illustration, the figures depict the general structure and/or manner of construction of the various embodiments. Descriptions and details of well-known features and techniques may be omitted to avoid unnecessarily obscuring other features. Elements in the figures are not necessarily drawn to scale: the dimensions of some features may be exaggerated relative to other elements to assist improve understanding of the example embodiments.

The terms "comprise," "include," "have" and any variations thereof are used synonymously to denote non-exclusive inclusion. The term "exemplary" is used in the sense of "example," rather than "ideal."

In the interest of conciseness, conventional techniques, structures, and principles known by those skilled in the art may not be described herein, including, for example, the operation of standard magnetic random access memory (MRAM) and the processing techniques used to manufacture of magnetoresistive devices.

During the course of this description, like numbers may be used to identify like elements according to the different figures that illustrate the various exemplary embodiments.

For the sake of brevity, conventional techniques related to reading and writing memory, and other functional aspects of certain systems and subsystems (and the individual operating components thereof) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter.

FIGS. 1-6 illustrate a magnetoresistive devices 100, 200, 300, 400, 500, and 600 where each magnetoresistive device includes a magnetic tunnel junction. In some embodiments, the magnetoresistive devices are included in magnetic memory cells that can be used in embedded or standalone MRAM applications in which high data retention and low switching current are beneficial. The techniques described herein mitigate the typical tradeoff in achieving high data retention and low switching current by improving the switching efficiency of the free portion of the magnetoresistive device. Other embodiments are targeted at achieving very high data retention or extremely low switching currents.

Each of the magnetoresistive devices in FIGS. 1-6 has a top electrode 110 and a bottom electrode 170 that provide for electrical connectivity to the magnetoresistive device. Between the top electrode 110 and the bottom electrode 170 is the magnetoresistive stack that includes a plurality of layers. Each of the plurality of layers used to form the magnetoresistive device is formed, deposited, grown, sputtered, or otherwise provided. The layers may be deposited using any technique now known or later developed. In an example embodiment, the plurality of layers includes a number of different layers of both magnetic and nonmagnetic material. For example, the layers may include multiple layers of magnetic material, dielectric layers that provide one or more tunnel barriers or diffusion barriers, coupling layers between layers of magnetic material that provide for ferromagnetic or antiferromagnetic coupling, antiferromagnetic material, and other layers utilized in magnetoresistive stacks as currently known or later developed.

Included in the plurality of layers making up the magnetoresistive stack of FIGS. 1-6 is a dielectric layer 150 that forms a tunnel junction between a fixed portion 160 and a free portion, where the free portion is different in each of FIGS. 1-6. The fixed portion 160, which is shown to include ferromagnetic layers 162 and 164 antiferromagnetically coupled by coupling layer 163 has a predetermined magnetic state, which, as indicated by the arrows within the fixed portion 160, is perpendicular to the plane in which the various layers are deposited. While the fixed portion 160 is illustrated to include a set of layers forming a synthetic antiferromagnetic structure (SAF), in other embodiments, it may include a set of layers forming a synthetic ferromagnetic structure (SYF). In yet other embodiments, the fixed portion 160 may be a single layer of material. Fixed portion 160 may achieve its fixed magnetization in a number of different ways. For example, the fixed portion can include antiferromagnetic material such as platinum manganese (PtMn) or iron manganese (FeMn), where such materials have a fixed magnetic state that can be used to influence other magnetic layers within the fixed portion 160. For example, the fixed portion can include a SAF having antiferromagnetic material that is used to pin other ferromagnetic layers within the SAF such that the fixed portion 160 is held in a predetermined magnetic state by the antiferromagnetic material. In other embodiments, the fixed portion includes an unpinned SAF having a magnetization that is typically fixed during manufacturing operations, but does not rely upon antiferromagnetic material. In yet other embodiments, the fixed magnetization of the fixed portion 160 is achieved through other means, including the manner in which the fixed portion 160 is formed (e.g. shape anisotropy).

Each of the free portions of the magnetoresistive stacks in FIGS. 1-6 is shown to include two ferromagnetic layers separated by a coupling layer. For example, the free portion 140 of the magnetoresistive device 100 of FIG. 1 includes ferromagnetic layers 142 and 144 separated by coupling layer 143. Ferromagnetic layers included in embodiments described herein may include a variety of materials, including, for example, cobalt (Co), iron (Fe), and nickel (Ni) as well as alloys such as NiFe, CoFeB, CoNi, FeB, CoB, CoFeB—X (where X can be Mo, W, etc). As discussed in more detail below, the particular materials included in the ferromagnetic layers as well as the coupling layers can be selected in order to vary the characteristics of the magnetoresistive devices. Notably, while the free portions of the magnetoresistive devices depicted in FIGS. 1-6 include two ferromagnetic layers, in other embodiments, the free portion can include more than two ferromagnetic layers and may also include additional coupling layers. In some embodiments one or more of the ferromagnetic layers can include multiple ferromagnetic materials that may or may not alloy together.

Each of the magnetoresistive devices shown in FIGS. 1-6 also includes another dielectric layer 130 forming a diffusion barrier, and at least one additional layer 120 forming a spacer layer. In other embodiments, the diffusion barrier and spacer layer are not included. The dielectric layers included in the magnetoresistive stacks of FIGS. 1-6 may include, for example, one or more layers of aluminum oxide and/or magnesium oxide (MgO). While each of FIGS. 1-6 illustrates a particular set of layers making up some example magnetoresistive stacks, it should be appreciated that a multitude of variations of the general stack structure can be used in the various embodiments of the inventions disclosed herein. For example, other embodiments may include multiple SAFs, SYFs, and tunnel barriers in addition to the other layers, where the materials and structures are arranged in various combinations and permutations now known or later developed.

Embodiments described herein provide for different magnetoresistive device characteristics that can be tuned, or selected, based on the specific materials, thicknesses, and other parameters of the layers included in the free portion of the magnetoresistive devices and the surrounding layers. For example, in some embodiments a lower switching current is achieved by providing a set of layers in the free portion having intentional imbalances in terms of the magnetic characteristics for each of those layers. In other embodiments, providing a set of layers having a particularly well-balanced set of ferromagnetic layers in terms of their magnetoresistive characteristics allows for better data retention over time. Some embodiments focus on longer data retention, other embodiments focus on lower switching currents, and yet other embodiments provide a balance between the two where high data retention with relatively low switching current is achieved. As discussed below, various example embodiments provide for a better understanding of the techniques employed to achieve the different magnetoresistive device characteristics.

Each of the ferromagnetic layers included in the free portion of the magnetoresistive devices of FIGS. 1-6 is characterized by a perpendicular magnetic anisotropy field parameter (Hk), which is a parameter that indicates the amount of magnetic field that needs to be applied to the layer in order to rotate its magnetic orientation from a position along the easy axis of the magnetic layer to a position perpendicular to the easy axis. The perpendicular magnetic anisotropy field parameter is sometimes referred to as a "kink field parameter." Thus, assuming FIG. 1 illustrates a perpendicular spin-torque magnetic tunnel junction, the easy axis for each of the ferromagnetic layers 142 and 144 is in the vertical direction. As such, in a resting state without any applied spin-torque or magnetic field, the magnetic state for each of the ferromagnetic layers 142 and 144 will correspond to a magnetic orientation in the upward direction or the downward direction. The perpendicular magnetic anisotropy field parameter for the ferromagnetic layer 142 corresponds to the amount of magnetic field perpendicular to the easy axis that must be applied in order to rotate the magnetic orientation of the ferromagnetic layer 142 to a horizontal position.

Conventionally, the free portion, which was often a SYF having two ferromagnetic layers separated by a coupling layer, was considered to be a unit, where the entirety of the free portion was characterized by a single Hk value. Thus, rather than considering the magnetic states of the individual ferromagnetic layers and in the free portion moving independently, the free portion was conventionally viewed as a whole, where the Hk value for the entire free portion indicated the magnetic field to be applied to the free portion in order to cause the free portion to change its magnetic state. In the present disclosure it is recognized that each of the ferromagnetic layers in the free portion has an independent Hk value, and, along with other parameters ascribed to the ferromagnetic layers, the independent Hk values can be tuned in order to achieve desirable characteristics for the overall free portion.

Thus, FIG. 1 illustrates a magnetoresistive device 100 having a free portion 140 that includes ferromagnetic layers 142 and 144 separated by a coupling layer 143. In different embodiments, the ferromagnetic layers 142 and 144 are ferromagnetically or antiferromagnetically coupled, may or may not have the same Hk value, may or may not have different magnetic moments, and may have higher or lower levels of exchange coupling, where these different factors determine the overall behavior of the free layer 140 in which they are included. FIGS. 2-6 help to illustrate different example embodiments in which certain of these parameters are varied in order to tune the resulting free portion to exhibit desired behavior in the resulting magnetoresistive devices.

Figure 2:
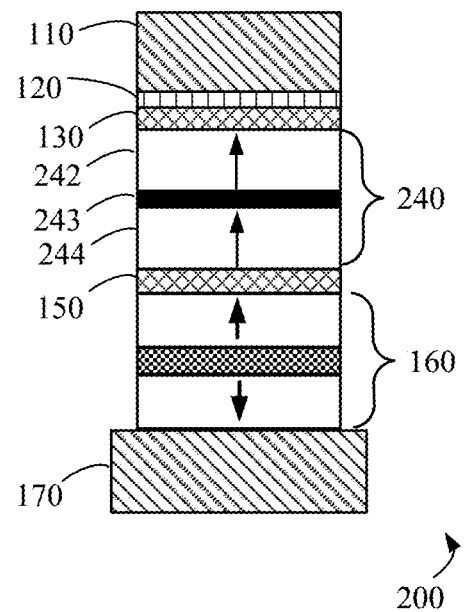

FIG. 2 illustrates an example embodiment of a magnetoresistive device 200 that includes a magnetoresistive stack in which the free portion 240 includes ferromagnetic layers 242 and 244 that are balanced in terms of their Hk parameters. When the Hk of the two ferromagnetic layers 242 and 244 is balanced, the memory cell exhibits better data retention. As such, in order to improve data retention in the memory cell the ferromagnetic layers in the free portion are formed to have a balanced Hk. Thus, in some embodiments, which, for example, are directed to memory cells having very good data retention, the Hk for layer 242 is equal to the Hk for layer 244. Notably, when comparing the Hk's of different layers included in the free portion, the term "equal" should be understood to include a small tolerance such that the Hk parameters for the layers are not precisely the same, but instead within a few percent (e.g. 5%) of each other. The Hk of the ferromagnetic layers 242 and 244 is derived from the intrinsic Hk of the material in the layers as well as Hk resulting from having an interface with a dielectric layer, such as the tunnel barrier 150 or the diffusion barrier 130. Thus, in order to balance the Hk's between the ferromagnetic layers 242 and 244, the material included in those layers or their interfaces with neighboring dielectric layers can be adjusted.

While some embodiments directed at very high data retention provide for ferromagnetic layers in the free portion with equal Hk's, other embodiments provide good data retention with ferromagnetic layers in the free portion that only have slightly unequal Hk's. For example, some embodiments include a first and second ferromagnetic layers in the free portion, where the second ferromagnetic layer has an Hk that is between 70% and 100% of the Hk of the first ferromagnetic layer. In yet other embodiments, the range of the Hk of the second ferromagnetic layer is between 80% and 100% of the Hk of the first magnetic layer. Further embodiments provide a range of the Hk of the second ferromagnetic layer that is between 90% and 100% of the Hk for the first magnetic layer. In general, when the Hk's of the ferromagnetic layers in the free layer are balanced, the magnetic states of the ferromagnetic layers tend to move together in unison when exposed to a magnetic field or thermal effects, and, as such, it is harder to switch the magnetic state of the free portion as both ferromagnetic layers must be switched together. In contrast, if the Hk of one of the ferromagnetic layers is significantly less than that of the other, the lower-Hk ferromagnetic layer can switch before the higher-Hk ferromagnetic layer and potentially drag the higher-Hk ferromagnetic layer with it. As such, unbalanced Hk's for the ferromagnetic layers in the free portion can result in less-robust data retention. However, in embodiments in which lower switching current is desired, such Hk mismatched ferromagnetic layers can help reduce the switching current. Notably, in free portions that include more than two ferromagnetic layers, better data retention is achieved if none of the ferromagnetic layers includes an Hk that is significantly out of balance with that of the other ferromagnetic layers in the free portion.

The Hk of each of the ferromagnetic layers 242 and 244 is determined by their makeup (e.g. material and thickness) as well as their interfaces with neighboring materials. As such, in some embodiments, balanced Hk's can be achieved with ferromagnetic layers of the same material and different thicknesses if the interfacial boundaries of the two ferromagnetic layers are different. As a specific example, a thicker layer may border a dielectric layer (e.g. the tunnel barrier), whereas a thinner layer does not. The additional Hk derived from the interface with the dielectric layer for the thicker layer balances that greater intrinsic Hk of the thinner layer. In some embodiments in which the ferromagnetic material is CoFeB, deposition of a small amount of iron (Fe) between the dielectric material such as MgO and the CoFeB can increase the Hk of one section of the free layer. The thin iron interface deposition may form a continuous atomic layer of iron or may mix with the ferromagnetic material in the final annealed structure resulting in a high-iron interface region adjacent to the dielectric. In other embodiments, the oxidation of the dielectric layer can be adjusted to increase/decrease the Hk of a ferromagnetic layer bordering the dielectric layer. For example, further oxidizing the dielectric layer 150 forming the tunnel barrier under the ferromagnetic layer 244 will increase the Hk of the ferromagnetic layer 244. Generally, increasing the oxidation of the tunnel barrier raises the resistance of the tunnel barrier, which has the effect of improving the interface between the tunnel barrier material and neighboring ferromagnetic material, thereby raising the Hk of the ferromagnetic material.

A free layer can include ferromagnetic layers that have balanced Hk's but have different magnetic moments. The difference in magnetic moments of the ferromagnetic layers can be the result of different materials included in the layers or different dimensions (e.g. thicknesses) of the layers. For example, the magnetic moment of the ferromagnetic layers can be adjusted by changing the proportions of the different materials included in the ferromagnetic layers. For example, including more boron (B) in a layer of CoFeB dilutes the magnetic material included in the layer and reduces its magnetic moment. Similarly, reducing the amount of boron in a CoFeB layer will increase the concentration of magnetic material in the layer and therefore provide a higher moment per unit volume for the material. As noted above, if the magnetic moment of the layers is different the Hk's can still be the same based on the interaction of one or both of the layers with surrounding materials, including the tunnel barrier, a diffusion barrier, an insertion layer, or the coupling layer between the ferromagnetic layers.

In embodiments in which the magnetic moments of the ferromagnetic layers in the free portion are different, the lower-magnetic moment ferromagnetic layer can be placed next to the tunnel barrier such that spin-torque switching current will have a greater impact on the overall free portion. Because of its position adjacent the tunnel barrier, the spin-torque current through the MTJ will have a greater impact on the lower-magnetic moment ferromagnetic layer, which can lead to that layer switching more readily than would be the case if the higher-magnetic moment ferromagnetic material is next to the tunnel barrier. As such, for free portions with a magnetic moment imbalance between the ferromagnetic layers, it may be preferable to place the lower-magnetic moment layer adjacent the tunnel barrier to reduce the switching current needed to switch the free layer.

The free portion 240 also includes coupling layer 243, which, in the embodiment illustrated, provides ferromagnetic coupling between the ferromagnetic layer 242 and the ferromagnetic layer 244. The ferromagnetic coupling between the ferromagnetic layers 242 and 244 results in the magnetic states of the ferromagnetic layers being aligned in the same direction in the steady state condition.

In some embodiments, the ferromagnetic coupling layer 243 is a nonmagnetic oscillatory coupling layer, where an oscillatory coupling layer provides either ferromagnetic or antiferromagnetic coupling between ferromagnetic layers depending upon the thickness of the oscillatory coupling layer. One example material used to provide such an oscillatory coupling layer is ruthenium (Ru). Other examples include iridium (Ir), chromium (Cr), and rhodium (Rh).

In other embodiments, the ferromagnetic coupling layer 243 includes or consists of a material such as tantalum (Ta), tungsten (W), or Molybdenum (Mo). Such materials may alloy with one or more of the ferromagnetic layers 242 and 244, thereby resulting in a ferromagnetic coupling layer 243 that includes or consists of such an alloy. Because the ferromagnetic coupling layer 243 is deposited after the ferromagnetic layer 244, the material in the coupling layer 243 often alloys with the material in the underlying ferromagnetic layer 244. Because such alloying can reduce the Hk of the underlying ferromagnetic layer 244, that layer may be deposited as a thicker layer than the layer 242 in order to achieve better balancing in the Hk values for the layers 242 and 244. In contrast to ruthenium, which does not alloy with the ferromagnetic materials and provides oscillatory coupling based on thickness, materials such as Ta, W, and Mo can alloy with the ferromagnetic materials and only provide ferromagnetic coupling between the ferromagnetic layers.

The material and thickness of the ferromagnetic coupling layer 243 determines the strength of the exchange coupling that the coupling layer establishes between the ferromagnetic layers 242 and 244. As such, imbalances between the Hk's of the ferromagnetic layers can be addressed to achieve higher data retention by increasing the exchange coupling strength of the coupling layer 243 such that it is harder for the lower-Hk layer to move independently of the higher-Hk layer. Similarly, to achieve lower switching current, imbalances in Hk's can be enhanced by lowering the exchange coupling to allow the lower-Hk layer to more easily switch alone. A coupling layer 243 with a thickness of the ferromagnetic peak thickness provides weaker exchange coupling, while a thinner continuous layer provides stronger exchange coupling.

Thus, the embodiment illustrated in FIG. 2 illustrates a magnetic stack that includes a free portion 240 having ferromagnetic layers 242 and 244 that have balanced Hk's and are ferromagnetically coupled by ferromagnetic coupling layer 243. The balanced Hk's provide for better data retention. Devices manufactured with such characteristics are useful in applications in which very high data retention is desired, including magnetic memories programmed during manufacturing that need to retain the programmed data during solder reflow operations that expose the devices to 260° C. for approximately 5 minutes. If the ferromagnetic layers have balanced Hk's but different magnetic moments, the lower-moment layer can be placed next to the tunnel barrier to provide switching at lower switching currents than would be required if the higher-moment layer were next to the tunnel barrier.

Figure 3:
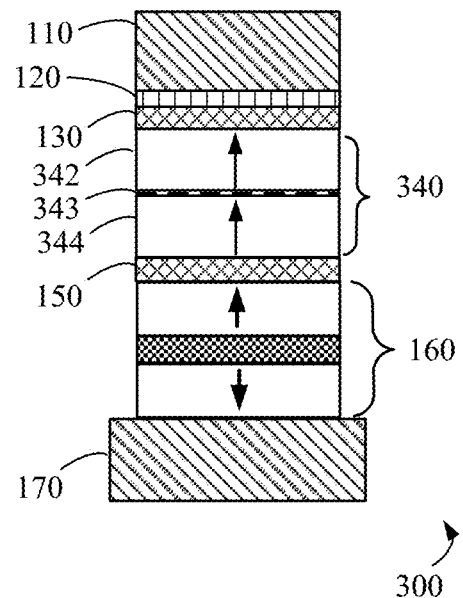

FIG. 3 illustrates an embodiment of a magnetoresistive device 300 that includes a free portion 340 having ferromagnetic layers 342 and 344 separated by a discontinuous coupling layer 343. While FIG. 2 illustrated a ferromagnetic coupling layer 243 that provided continuous separation between the two ferromagnetic layers 242 and 244, the discontinuous coupling layer 343 depicted in FIG. 3 does not provide complete separation between the two ferromagnetic layers 342 and 344. In one embodiment, the discontinuous coupling layer 343 is a discontinuous layer of magnesium oxide (MgO). The discontinuous coupling layer 343 results in ferromagnetic coupling between ferromagnetic layers 342 and 344 where the discontinuous coupling layer 343 breaks the coupling between the layers 342 and 344 to some degree depending on the degree of discontinuity of the coupling layer 343. Because the coupling layer is discontinuous some coupling between the layers continues to exist. The discontinuous coupling layer 343 also generates perpendicular magnetic anisotropy (PMA) where it interfaces with the ferromagnetic layers 342 and 344. As such, a discontinuous coupling layer between the ferromagnetic layers in the free portion provides another way to adjust the level of exchange coupling between the ferromagnetic layers included in the free portion while also impacting the Hk values of each of the layers 342 and 344.

In some embodiments corresponding to FIG. 3, the ferromagnetic layers 342 and 344 are formed to have generally balanced Hk's such that high data retention is achieved. As was the case with the embodiment discussed in FIG. 2 above, if one of the ferromagnetic layers 342 and 344 has a lower magnetic moment than the other, that layer can be placed adjacent the tunnel barrier 150 in order to reduce the amount of switching current needed to switch the free portion 340. Similarly, the level of balance between the Hk's of the ferromagnetic layers 342 and 344 can be controlled in order to achieve the desired level of data retention, while also influencing the amount of write current needed to change the state of the free portion 340.

Figure 4:
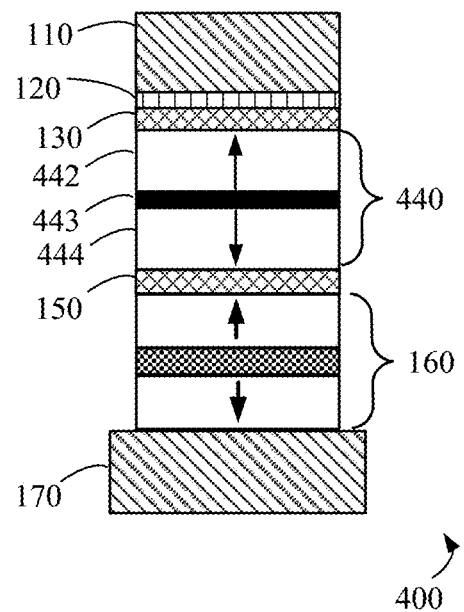

FIG. 4 illustrates a magnetoresistive device 400 having a free portion 440 in which the ferromagnetic layers 442 and 444 are antiferromagnetically coupled. The antiferromagnetic coupling between ferromagnetic layers 442 and 444 can be achieved by using an oscillatory coupling layer 443, where the thickness of the oscillatory coupling layer 443 is such that it provides antiferromagnetic coupling between the ferromagnetic layers 442 and 444 rather than ferromagnetic coupling as was depicted in the embodiment of FIG. 2. As noted above, one example of an oscillatory coupling layer is ruthenium.

As was the case with the embodiments discussed above, the ferromagnetic layers 442 and 444 may be formed such that they are generally balanced in terms of their Hk parameters, thereby providing high data retention. While the magnetic moments of the layers 442 and 444 may be the same, in embodiments in which one is less than the other, the layer having the lesser magnetic moment is preferably positioned adjacent the tunnel barrier 150 in order to reduce the amount of switching current needed to change the state of the free portion 440. Similarly, if lower switching current is more of a priority, an intentional mismatch in Hk's between the ferromagnetic layers 442 and 444 can be used to provide such a lower switching current, with the potential tradeoff of lower data retention.

Figure 5:
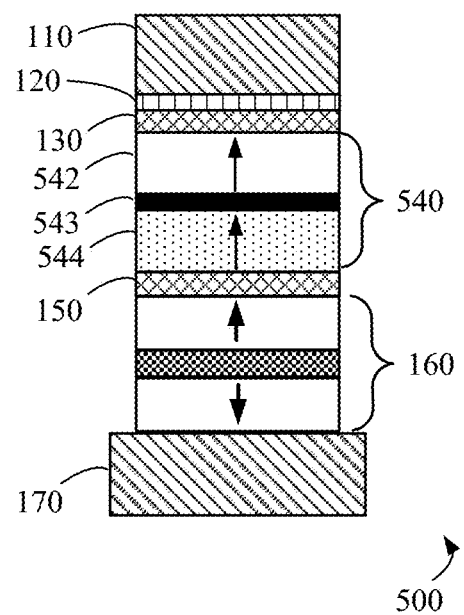

FIG. 5 illustrates another embodiment of a magnetoresistive device 500 that includes a free portion 540 having ferromagnetic layers 542 and 544 separated by a ferromagnetic coupling layer 543. In the embodiment illustrated in FIG. 5, it is assumed that ferromagnetic layers 542 and 544 are different in composition in terms of the materials used to form those layers. However, while layer 542 may include different materials than layer 544, is still possible to balance the Hk's for those layers in order to achieve a desired level of data retention. For example, the thickness of material 544 may be adjusted in order to increase or decrease its Hk. In another example, the interface of ferromagnetic material layer 544 with the tunnel barrier layer 150 can be modified in order to provide additional PMA at that interface, thereby boosting the Hk of the ferromagnetic layer 544. As discussed above, the level of balance between the ferromagnetic layers 542 and 544 can be tuned in order to achieve a particular level of data retention or a particular level of switching current needed to support the intended application. As such, while some embodiments will strive for equal Hk's between the ferromagnetic layers 542 and 544 in order to maximize data retention, others may allow for differentiation between the Hk's of these layers, where the Hk of one of the layers is within a certain percentage of the other layer.

While FIG. 5 illustrates an embodiment in which different materials are included in the ferromagnetic layers 542 and 544 of the free portion 540 where such ferromagnetic layers are separated by a ferromagnetic coupling layer 543, other embodiments include such differing ferromagnetic layers separated by anti-ferromagnetic coupling layers or discontinuous coupling layers such as those discussed above with respect to FIGS. 3 and 4. Moreover, while the Hk's for the ferromagnetic layers in FIG. 5 can be balanced in order to allow for greater data retention, the use of different materials for the ferromagnetic layers can also be used to intentionally create an Hk or magnetic moment mismatch between the two ferromagnetic layers in order to provide for reduced write currents. Such Hk and/or magnetic moment mismatching between the ferromagnetic layers is discussed in more detail with respect to FIG. 6 below.

Figure 6:
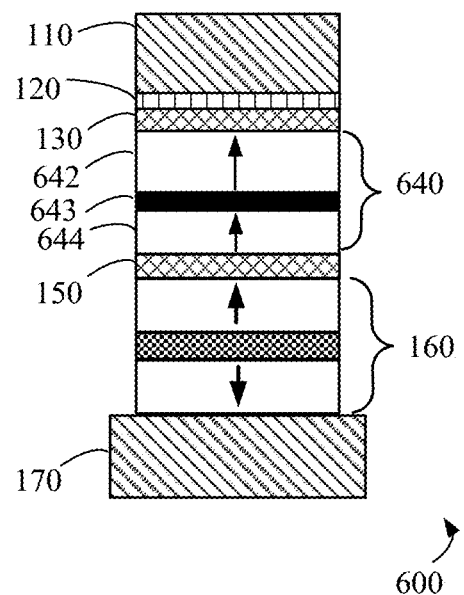

FIG. 6 illustrates yet another embodiment of a magnetoresistive device 600 having a free portion 640 that includes ferromagnetic layers 642 and 644 separated by a coupling layer 643. In the embodiment shown in FIG. 6, the thickness of the ferromagnetic layer 644 is less than the thickness of the ferromagnetic layer 642. In some embodiments, the thickness difference results in an imbalance in the magnetic moments and/or Hk's of the ferromagnetic layers 642 and 644, where, for example, the Hk of layer 644 is less than the Hk of layer 642. In such embodiments, the imbalance may be beneficial in that the lower-moment/lesser-Hk ferromagnetic layer 644 is easier to switch then the higher-moment/greater-Hk ferromagnetic layer 642. As such, depending on the level of coupling between the ferromagnetic layers 642 and 644, the ferromagnetic layer 644 may be more susceptible to changes in its magnetic state in response to a spin-torque switching current than the ferromagnetic layer 642. The susceptibility to switching for each of the ferromagnetic layers is based on the moment per unit volume of the layer multiplied by the Hk of the layer further multiplied by the thickness of the layer.

While imbalanced ferromagnetic layers may result in relatively lower levels of data retention, the imbalance can provide the advantage of requiring a lower switching current in order to change the state of the free portion 640. Because the ferromagnetic layer 644 can switch more easily due to the moment and/or Hk imbalance, the ferromagnetic layer 644 can switch first and then drag the other ferromagnetic layer 642 along due to the ferromagnetic coupling between the ferromagnetic layers 644 and 642. Notably, reducing the amount of coupling between the ferromagnetic layers 642 and 644 can allow the ferromagnetic layers to move more independently, thereby allowing the ferromagnetic layer 644 to switch more readily than it would if greater strength exchange coupling closely tied the ferromagnetic layer 644 to the higher-moment/greater-Hk ferromagnetic layer 642. In some embodiments, lower switching current can be attained while maintaining a high switching efficiency in which the energy barrier (Eb) to switching current (Ic) ratio is high.

While the magnetic moment and/or Hk imbalance between the ferromagnetic layers 642 and 644 is shown in FIG. 6 to be based on differing thicknesses between those two layers, in other embodiments, the magnetic moment and/or Hk imbalance can be due to other factors. For example, a magnetic moment imbalance can be achieved by using different materials for the ferromagnetic layers 642 and 644 or different concentrations of the same materials (e.g. a lower percentage of boron in a first CoFeB layer 644 than a second CoFeB layer 642). In another example, the interface for either of the ferromagnetic layers 642 and 644 with a dielectric layer can be adjusted in order to tune the Hk for that particular layer in order to achieve the desired level of imbalance. For example, a high-iron insertion layer could be included to increase the overall Hk of a ferromagnetic layer. As is depicted in FIG. 6, if the Hk of the ferromagnetic layer 644 is less than the Hk of the ferromagnetic layer 642, the ferromagnetic layer 644 is preferably placed adjacent to the tunnel barrier 150 such that the spin-torque current applied through the magnetoresistive device 600 impacts the lower Hk ferromagnetic material 644.

Thus, while an imbalance in the magnetic moment and or Hk between the ferromagnetic layers 642 and 644 can result in somewhat reduced data retention than that achievable with balanced ferromagnetic layers, the reduced write current requirements may be beneficial in some applications. For example, in memory applications in which DRAM-like characteristics are desired (e.g. low write current, high speed, and limited data retention) the advantages provided by embodiments with imbalanced ferromagnetic layers in the free portion may outweigh the disadvantages.

Notably, while FIG. 6 depicts ferromagnetic coupling between layers 642 and 644, in other embodiments ferromagnetic layers 642 and 644 may be antiferromagnetically coupled. Moreover, the ferromagnetic coupling layer 643 depicted in FIG. 6 can include an oscillatory coupling layer, a coupling layer that may include or consists of a material that can alloy with one or more of the ferromagnetic layers 642, or a discontinuous coupling layer such as that depicted in FIG. 3. Thus, the same variations used in embodiments in which the ferromagnetic layers in the free portion were generally balanced can be applied to embodiments in which the ferromagnetic layers in the free portion are intentionally unbalanced.

Figure 7:
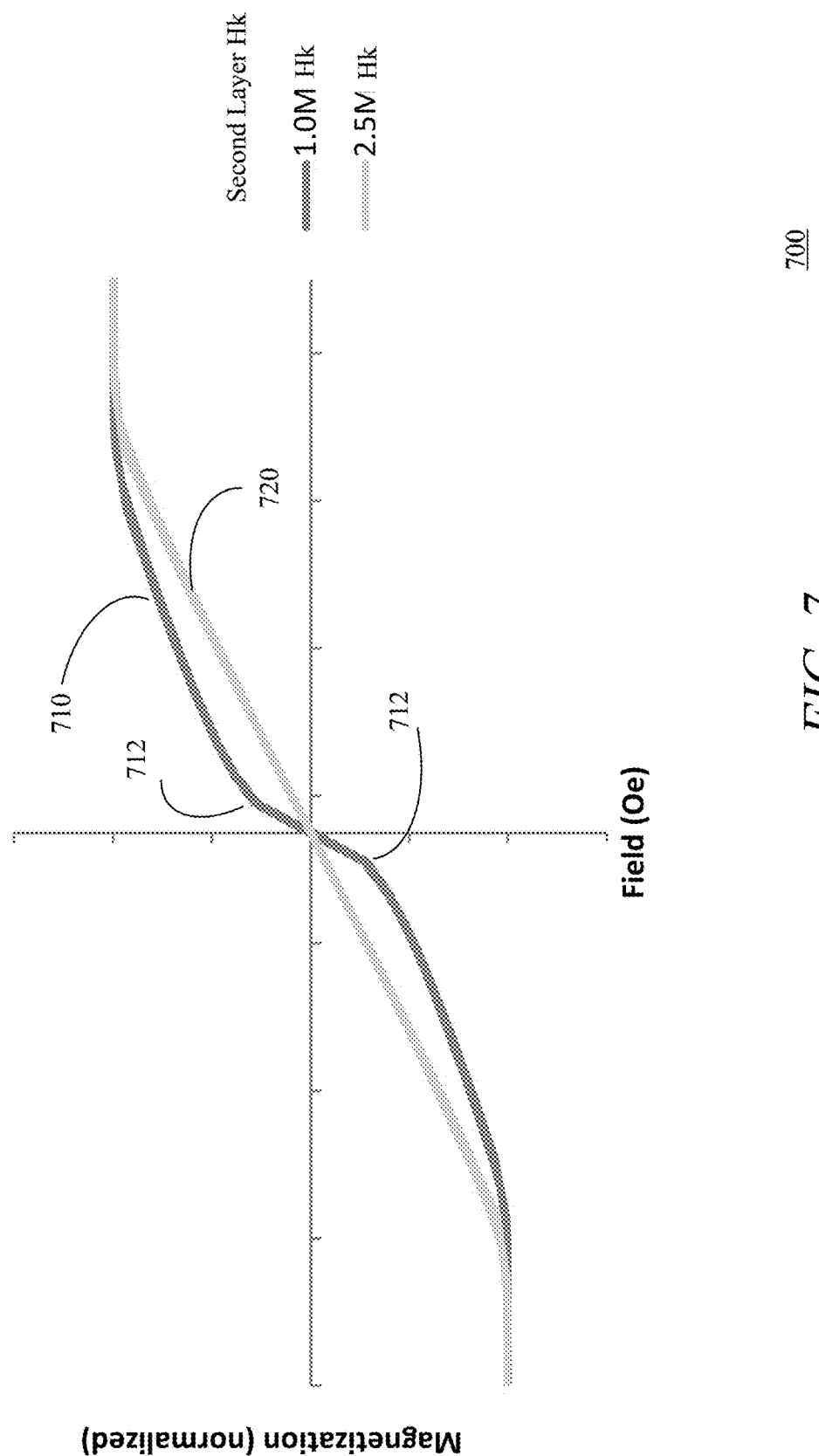
FIG. 7 is a graph illustrating changes in magnetic state for two different free portions used in magnetoresistive devices in accordance with exemplary embodiments.

FIG. 7 illustrates a graph 700 showing the difference in how a free portion with balanced ferromagnetic layers switches in comparison to a free portion with unbalanced ferromagnetic layers. The darker curve 710 depicted in FIG. 7 corresponds to a free portion in which the Hk of one of the ferromagnetic layers included in the free portion is significantly different than the Hk of the other ferromagnetic layer in the free portion. In the example graph, the Hk is assumed to be 2.5 times greater for one of the ferromagnetic layers than that of the other. As shown by the curve 710, a significant kink 712 or sharp transition occurs just on either side of the vertical axis. The significant kink 712 corresponds to the transition of the lower Hk ferromagnetic layer from one magnetic state to the other. The presence of the kink 712 is indicative of an Hk mismatch between ferromagnetic layers included in the free portion. In contrast, the curve 720 is generally linear, thereby indicating that the two ferromagnetic layers within the free portion are changing state together, rather than one transitioning significantly before the other. Thus, the curve 720 is indicative of a free portion having ferromagnetic layers that are generally balanced in terms of their Hk.

Thus, FIG. 7 shows how the balancing of the Hk's for the individual layers within the free portion can result in the ferromagnetic layers of the free portion switching together or separately. As noted above, conventional thinking viewed the ferromagnetic layers in the free portion simply as part of an overall unit that had a single Hk value attributed to it. Such conventional thinking did not address the fact that the differentiation in Hk values for the ferromagnetic layers could result in the layers moving independently. By controlling the Hk of the individual layers within the free portion, as well as the level of ferromagnetic or antiferromagnetic coupling between those layers, the desired switching characteristics for the free layer can be tuned in order to achieve switching characteristics best suited to the application in which the magnetoresistive device is to be used.

As noted above, in some instances the desired characteristics are lower switching current with the understanding that such lower switching current may come at the price of less data retention capability. In other embodiments, the data retention is the highest priority, where matching the Hk parameters for the ferromagnetic layers in the free portion provides for such high data retention. Within the framework of generally matched Hk values including a ferromagnetic layer having a lower magnetic moment adjacent the tunnel barrier can help reduce the needed switching current in order to change the magnetic state of the free portion. By understanding how the characteristics of the ferromagnetic layers included in the free layer, as well as the level of exchange coupling between those layers, impact the overall nature of the free portion, the various layers within the free portion can be tuned in order to achieve the desired characteristics for the overall free portion.

Manufacturing memory cells, which may be used in embedded or standalone MRAM applications, to have desired characteristics based on the composition and structure of the free portion of the magnetoresistive stack can include processing steps intended to properly tune the ferromagnetic layers and associated coupling layer within the free portion of the magnetoresistive stack. After depositing a layer of conductive material from which the bottom electrode is formed, the various layers included in the fixed portion of the magnetoresistive stack are deposited. As noted above, the fixed portion can include various layers, including those making up a pinned or unpinned SAF. A dielectric layer is then deposited over the fixed portion layers, where the dielectric layer corresponds to the tunnel barrier within the magnetoresistive stack. Following deposition of the dielectric layer from which the tunnel barrier is formed, the layers making up the free portion are deposited. As discussed above, a high iron interface layer can be inserted between the dielectric layer used for forming the tunnel barrier and one of the ferromagnetic layers included in the free layer in order to increase the Hk of the ferromagnetic layer.

The layers of material corresponding to the free portion that are deposited include at least two ferromagnetic layers separated by a coupling layer. In some embodiments, the material for the ferromagnetic layers within the free portion are deposited in a manner that is intended to create ferromagnetic layers within the magnetoresistive stack having equal Hk's. In other embodiments, deposition of the ferromagnetic layers takes into account that after etching the ferromagnetic layers included within the magnetoresistive stack will have intentionally unbalanced Hk's in order to promote lower switching current. In yet other embodiments, the balance between the ferromagnetic layers is determined in order to obtain the desired switching current and data retention characteristics for a particular application. As discussed above, the type of materials deposited, the thickness of the materials deposited, and the inclusion of interface layers can all be varied in order to eventually provide a magnetoresistive stack with the desired characteristics for the free portion. As also noted above, in embodiments in which one of the ferromagnetic layers included in the free portion has a lower Hk or lower magnetic moment, that layer is preferably deposited adjacent to the dielectric layer used to form the tunnel barrier in order to reduce switching current.

When depositing the layers corresponding to the free portion, the material and material thickness chosen for the coupling layer determines whether there is ferromagnetic or antiferromagnetic coupling between the ferromagnetic layers within the free portion. As discussed above, in some embodiments, ferromagnetic coupling is accomplished by continuous layer of material such as Ta, Mo, or W. Such materials may alloy with the ferromagnetic layers within the free portion, and in some embodiments the coupling layer includes or consists of such alloyed materials. In other embodiments, an oscillatory coupling layer is employed, where materials such as Ru, Ir, Cr, or Rh provide either ferromagnetic or antiferromagnetic coupling between the ferromagnetic layers depending upon the thickness of the coupling layer in the resulting magnetoresistive stack. In yet other embodiments, a discontinuous layer of a material such as MgO is inserted between the layers of ferromagnetic material, where the discontinuous layer allows for limited ferromagnetic coupling and may also provide additional PMA.

Following deposition of the layers corresponding to the free portion, an additional layer of dielectric material is deposited in some embodiments, where the interface between the additional dielectric layer, which may be a diffusion barrier, and the uppermost ferromagnetic layer within the free portion can contribute additional Hk to that ferromagnetic layer. A layer of spacer material can then be deposited over the dielectric layer, where it is understood that in some embodiments the additional layer of dielectric material and layer of spacer material may be omitted. Following deposition of the layer of spacer material, additional conductive material corresponding to the top electrode is deposited. Once all layers been deposited, etching is performed in order to form the magnetoresistive stack. As is well understood the art, the deposition and etching of the layers in the magnetoresistive stack can be separated into multiple separate deposition and etching steps, where some portions of the magnetoresistive stack may be encapsulated or otherwise protected during the formation of the magnetoresistive stack.

Notably, in other embodiments the free portion of the magnetoresistive stack may be below the tunnel barrier instead of above the tunnel barrier as has been described and illustrated herein. Moreover, the overall set of layers included within the magnetoresistive stack may be different than the example embodiments disclosed herein. However, in each embodiments the ferromagnetic layers within the free portion are viewed independently in terms of their magnetoresistive characteristics, including their magnetic momentum and respective Hk values. Moreover, the degree of coupling between the ferromagnetic layers within the free portion is also controllable based on the composition and thickness of the coupling layer disposed between the ferromagnetic layers. By understanding the variables that contribute to the different characteristics of the free portion within a magnetoresistive stack, the free portion can be tuned in order to provide desirable characteristics for the free portion, which, for example, can lead to increased data retention and/or lower switching currents.

While some conventional magnetoresistive devices included two ferromagnetic layers separated by a coupling layer in the free portion of their magnetic stacks, those ferromagnetic layers were not viewed separately in terms of their Hk values. While such conventional free portions may be depicted as having similar material layers of the same thickness, that does not provide adequate support to establish that those layers have equal Hk's as other factors must be taken into account when determining the Hk for each of those ferromagnetic layers. For example, the alloying of the coupling layer with the ferromagnetic layers and the interface of the ferromagnetic layers with adjacent dielectric layers and/or insertion layers will impact the Hk of each of the ferromagnetic layers.

Although the described exemplary embodiments disclosed herein are directed to various magnetoresistive-based devices, the present disclosure is not necessarily limited to the exemplary embodiments. For example, while the embodiments above are focused on perpendicular spin-torque devices, the techniques are also applicable to in-plane spin-torque memory devices in which the easy axis for the ferromagnetic layers lies in the same plane as the layers are formed. Thus, the particular embodiments disclosed above are illustrative only and should not be taken as limitations, as the embodiments may be modified and practiced in different but equivalent manners apparent to those skilled in the art having the benefit of the teachings herein. Accordingly, the foregoing description is not intended to limit the disclosure to the particular form set forth, but on the contrary, is intended to cover such alternatives, modifications and equivalents as may be included within the spirit and scope of the inventions as defined by the appended claims so that those skilled in the art should understand that they can make various changes, substitutions and alterations without departing from the spirit and scope of the inventions in their broadest form.

What is claimed is:

1. A magnetoresistive device, comprising:
a fixed portion, wherein a magnetic state for the fixed portion is in a predetermined state;
a free portion, wherein the free portion includes:
a first magnetic layer having a first perpendicular magnetic anisotropy field parameter, wherein the first perpendicular magnetic anisotropy field parameter corresponds to a first magnetic field that is required to move a magnetic state of the first magnetic layer from a position along an easy axis of the first magnetic layer to a position perpendicular to the easy axis of the first magnetic layer;
a second magnetic layer having second perpendicular magnetic anisotropy field parameter, wherein the second perpendicular magnetic anisotropy field parameter corresponds to a second magnetic field that is required to move a magnetic state of the second magnetic layer from a position along an easy axis of the second magnetic layer to a position perpendicular to the easy axis of the second magnetic layer, wherein the second perpendicular magnetic anisotropy field parameter is equal to the first perpendicular magnetic anisotropy field parameter; and
a coupling layer between the first magnetic layer and the second magnetic layer; and
a first dielectric layer between the fixed portion and the free portion.

2. The magnetoresistive device of claim 1, wherein a magnetic moment of the first magnetic layer is less than a magnetic moment of the second magnetic layer.

3. The magnetoresistive device of claim 2, wherein the first magnetic layer is adjacent to the first dielectric layer.

4. The magnetoresistive device of claim 1, wherein the first dielectric layer is a tunnel barrier included in a magnetic tunnel junction.

5. The magnetoresistive device of claim 1, wherein the first magnetic layer is adjacent to the first dielectric layer, and wherein the magnetoresistive device further comprises:
a second dielectric layer adjacent to the second magnetic layer.

6. The magnetoresistive device of claim 1, wherein the coupling layer is a nonmagnetic oscillatory coupling layer.

7. The magnetoresistive device of claim 6, wherein the coupling layer includes ruthenium (Ru), iridium (Ir), chromium (Cr), or rhodium (Rh).

8. The magnetoresistive device of claim 6, wherein the coupling layer is configured to antiferromagnetically couple the first magnetic layer and the second magnetic layer.

9. The magnetoresistive device of claim 1, wherein the coupling layer is configured to ferromagnetically couple the first magnetic layer and the second magnetic layer.

10. The magnetoresistive device of claim 1, wherein the coupling layer includes an alloy of a coupling material and material included in the first or second magnetic layers.

11. The magnetoresistive device of claim 1, wherein the coupling layer is a discontinuous layer.

12. The magnetoresistive device of claim 11, wherein the coupling layer is a discontinuous layer of magnesium oxide (MgO).

13. A magnetoresistive device, comprising:
a fixed portion, wherein a magnetic state for the fixed portion is in a predetermined state;
a free portion, wherein the free portion includes:
a first magnetic layer having a first perpendicular magnetic anisotropy field parameter, wherein the first perpendicular magnetic anisotropy field parameter corresponds to a first magnetic field that is required to move a magnetic state of the first magnetic layer from a position along an easy axis of the first magnetic layer to a position perpendicular to the easy axis of the first magnetic layer;

a second magnetic layer having second perpendicular magnetic anisotropy field parameter, wherein the second perpendicular magnetic anisotropy field parameter corresponds to a second magnetic field that is required to move a magnetic state of the second magnetic layer from a position along an easy axis of the second magnetic layer to a position perpendicular to the easy axis of the second magnetic layer, wherein the second magnetic layer is more susceptible to changes in magnetic state in response to a spin-torque switching current than the first magnetic layer; and a coupling layer between the first magnetic layer and the second magnetic layer; and a first dielectric layer adjacent the second magnetic layer, wherein the first dielectric layer is between the fixed portion and the free portion.

14. The magnetoresistive device of claim 13, wherein a magnetic moment of the second magnetic layer is less than a magnetic moment of the first magnetic layer.

15. The magnetoresistive device of claim 13, wherein a thickness of the first magnetic layer is greater than a thickness of the second magnetic layer.

16. The magnetoresistive device of claim 13, wherein the second perpendicular magnetic anisotropy field parameter is less than the first perpendicular magnetic anisotropy field parameter.

17. The magnetoresistive device of claim 13, wherein the first dielectric layer is a tunnel barrier included in a magnetic tunnel junction.

18. The magnetoresistive device of claim 13 further comprises a second dielectric layer adjacent to the first magnetic layer.

19. The magnetoresistive device of claim 13, wherein the coupling layer is a nonmagnetic oscillatory coupling layer.

20. The magnetoresistive device of claim 13, wherein the coupling layer is configured to ferromagnetically couple the first magnetic layer and the second magnetic layer.

* * * * *